US008645887B2

(12) United States Patent
Lai et al.

(10) Patent No.: US 8,645,887 B2
(45) Date of Patent: Feb. 4, 2014

(54) METHOD AND SYSTEM FOR MODEL-BASED DESIGN AND LAYOUT OF AN INTEGRATED CIRCUIT

(75) Inventors: Ya-Chieh Lai, Sunnyvale, CA (US); Frank E. Gennari, San Jose, CA (US); Matthew Moskewicz, San Mateo, CA (US); Srinivas Doddi, Fremont, CA (US); Junjiang Lei, Bellevue, WA (US); Weiping Fang, Fremont, CA (US); Kuanghao Lay, Mountain View, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/535,242

(22) Filed: Jun. 27, 2012

(65) Prior Publication Data
US 2012/0272201 A1    Oct. 25, 2012

Related U.S. Application Data

(62) Division of application No. 12/133,563, filed on Jun. 5, 2008, now Pat. No. 8,381,152.

(51) Int. Cl.
G06F 17/50    (2006.01)
(52) U.S. Cl.
USPC ......................................................... 716/110
(58) Field of Classification Search
USPC ......................................................... 716/110
See application file for complete search history.

(56) References Cited

U.S. PATENT DOCUMENTS

| 5,801,954 | A | 9/1998 | Le et al. |
|---|---|---|---|
| 5,815,685 | A | 9/1998 | Kamon |
| 6,044,007 | A | 3/2000 | Capodieci |
| 6,057,249 | A | 5/2000 | Chen |
| 6,131,182 | A | 10/2000 | Beakes et al. |
| 6,171,731 | B1 | 1/2001 | Medvedeva et al. |
| 6,187,483 | B1 | 2/2001 | Capodieci et al. |
| 6,393,602 | B1 | 5/2002 | Atchison et al. |
| 6,397,373 | B1 | 5/2002 | Tseng et al. |
| 6,425,112 | B1 | 7/2002 | Bula et al. |
| 6,453,274 | B2 | 9/2002 | Kamon |

(Continued)

FOREIGN PATENT DOCUMENTS

CA    1894692 A    1/2007

OTHER PUBLICATIONS

Notice of Allowance dated Jun. 10, 2010 for U.S. Appl. No. 11/609,901.

(Continued)

Primary Examiner — Suresh Memula
(74) Attorney, Agent, or Firm — Vista IP Law Group, LLP

(57) ABSTRACT

A approach is described for allowing electronic design, verification, and optimization tools to implement very efficient approaches to allow the tools to directly address the effects of manufacturing processes, e.g., to identify and prevent problems caused by lithography processing. Fast models and pattern checking are employed to integrate lithography and manufacturing aware processes within EDA tools such as routers.

20 Claims, 13 Drawing Sheets

(56) References Cited

U.S. PATENT DOCUMENTS

| | | |
|---|---|---|
| 6,453,457 B1 | 9/2002 | Pierrat et al. |
| 6,492,066 B1 | 12/2002 | Capodieci et al. |
| 6,523,162 B1 | 2/2003 | Agrawal et al. |
| 6,611,946 B1 | 8/2003 | Richardson et al. |
| 6,804,394 B1 | 10/2004 | Hsu |
| 6,883,158 B1 | 4/2005 | Sandstrom et al. |
| 6,902,855 B2 | 6/2005 | Peterson et al. |
| 7,003,758 B2 | 2/2006 | Ye et al. |
| 7,155,698 B1 | 12/2006 | Gennari |
| 7,175,940 B2 | 2/2007 | Laidig et al. |
| 7,243,316 B2 | 7/2007 | White et al. |
| 7,318,214 B1 | 1/2008 | Prasad et al. |
| 7,386,162 B1 | 6/2008 | Dakshina-Murthy et al. |
| 7,386,433 B2 | 6/2008 | Maclean et al. |
| 7,403,265 B2 | 7/2008 | Tinnemans et al. |
| 7,418,693 B1 | 8/2008 | Gennari |
| 7,444,616 B2 | 10/2008 | Sandstrom et al. |
| 7,512,927 B2 | 3/2009 | Gallatin et al. |
| 7,530,048 B2 | 5/2009 | Joshi |
| 7,566,517 B1 | 7/2009 | Adel et al. |
| 7,646,906 B2 | 1/2010 | Saidin et al. |
| 7,689,966 B2 | 3/2010 | Verma et al. |
| 7,695,876 B2 | 4/2010 | Ye et al. |
| 7,707,542 B1 | 4/2010 | Gennari |
| 7,739,651 B2 | 6/2010 | Melvin et al. |
| 7,752,584 B2 | 7/2010 | Yang |
| 7,818,707 B1 | 10/2010 | Gennari |
| 7,966,586 B2 | 6/2011 | Lei |
| 8,079,005 B2 | 12/2011 | Lai |
| 2002/0083401 A1 | 6/2002 | Breiner et al. |
| 2003/0061592 A1 | 3/2003 | Agrawal et al. |
| 2003/0103189 A1 | 6/2003 | Neurether et al. |
| 2003/0118917 A1 | 6/2003 | Zhang et al. |
| 2003/0192013 A1 | 10/2003 | Cote et al. |
| 2004/0003357 A1 | 1/2004 | Palusinski et al. |
| 2004/0076323 A1 | 4/2004 | Fujii et al. |
| 2004/0086197 A1 | 5/2004 | Fletcher et al. |
| 2004/0123265 A1 | 6/2004 | Andreev et al. |
| 2004/0202355 A1 | 10/2004 | Hillhouse |
| 2005/0015740 A1 | 1/2005 | Sawicki et al. |
| 2005/0044514 A1 | 2/2005 | Wu et al. |
| 2005/0044522 A1 | 2/2005 | Maeda |
| 2005/0076322 A1 | 4/2005 | Ye et al. |
| 2005/0100802 A1 | 5/2005 | Callan et al. |
| 2005/0114822 A1 | 5/2005 | Axelrad et al. |
| 2005/0130047 A1 | 6/2005 | Kroyan |
| 2005/0198602 A1 | 9/2005 | Brankner |
| 2005/0251771 A1 | 11/2005 | Robles |
| 2006/0075379 A1 | 4/2006 | Kamat |
| 2006/0123380 A1 | 6/2006 | Ikeuchi |
| 2006/0206851 A1 | 9/2006 | Van Wingerden et al. |
| 2006/0228041 A1 | 10/2006 | Joshi |
| 2006/0271907 A1 | 11/2006 | Izuha et al. |
| 2006/0277520 A1 | 12/2006 | Gennari |
| 2007/0077504 A1 | 4/2007 | Park |
| 2007/0198958 A1 | 8/2007 | Tang et al. |
| 2007/0234246 A1* | 10/2007 | Sinha et al. ............... 716/4 |
| 2007/0266362 A1 | 11/2007 | Lai et al. |
| 2008/0288909 A1 | 11/2008 | Leijten-Nowak |
| 2009/0300561 A1 | 12/2009 | Tong et al. |

OTHER PUBLICATIONS

Notice of Allowance dated Mar. 1, 2010 for U.S. Appl. No. 11/609,892.
Non-Final Office action dated Feb. 19, 2010 for U.S. Appl. No. 11/609,901.
Notice of Allowance mailed Apr. 9, 2009 for U.S. Appl. No. 11/207,266.
Notice of Allowance mailed Dec. 22, 2008 for U.S. Appl. No. 11/207,266.
Non-Final OA mailed Apr. 25, 2008 for U.S. Appl. No. 11/207,266.
Non-Final OA mailed Nov. 30, 2007 for U.S. Appl. No. 11/207,266.
Non-Final OA mailed Feb. 18, 2009 for U.S. Appl. No. 11/609,892.
Notice of Allowance mailed May 29, 2009 for U.S. Appl. No. 11/609,903.
Non-Final OA mailed Nov. 5, 2008 for U.S. Appl. No. 11/609,903.
Final OA mailed Apr. 13, 2009 for U.S. Appl. No. 11/609,903.
Non-Final OA mailed Jul. 23, 2009 for U.S. Appl. No. 11/609,904.
Non-Final OA mailed Sep. 15, 2008 for U.S. Appl. No. 11/609,904.
Notice of Allowance dated Apr. 21, 2008 for U.S. Appl. No. 11/207,267.
Non-Final OA dated Nov. 30, 2007 for U.S. Appl. No. 11/207,267.
Final OA mailed Jul. 17, 2009 for U.S. Appl. No. 11/609,895.
Non-Final OA mailed Mar. 16, 2009 for U.S. Appl. No. 11/609,895.
Non-Final OA mailed Sep. 18, 2008 for U.S. Appl. No. 11/609,895.
Restriction Requirement dated Nov. 18, 2009 for U.S. Appl. No. 11/609,901.
Notice of Allowance dated Feb. 10, 2011 for U.S. Appl. No. 11/952,912.
Notice of Allowance dated Jun. 25, 2010 for U.S. Appl. No. 11/965,680.
Notice of Allowance dated Nov. 2, 2010 for U.S. Appl. No. 11/965,680.
Non-Final Office Action dated Oct. 4, 2010 for U.S. Appl. No. 11/952,912.
Non-Final Office Action dated Nov. 20, 2009 for U.S. Appl. No. 11/965,680.
Genarri, Frank E. et al., "A Pattern Matching System for Linking TCAD and EDA." Proceedings of the 5th International Symposium on Quality electronic Design, pp. 165-170, 2004.
Roseboom, E. et al., "Automated Full-Chip Hotspot Detection and Removal Flow for Interconnect Layers of Cell-Based Designs" SPIE 2007.
International Search Report and Written Opinion dated Jul. 21, 2009 for PCT Application No. PCT/US09/46215.
Non-Final Office Action dated Jun. 23, 2011 for U.S. Appl. No. 12/133,563.
Notice of Allowance Mailed on May 10, 2012 for U.S. Appl. No. 12/133,563.
Final Office Action Mailed on Nov. 28, 2011 for U.S. Appl. No. 12/133,563.
Non-Final Office Action dated Apr. 29, 2013 for U.S. Appl. No. 13/353,225.
Foreign Office Action dated Aug. 9, 2013 for Chinese Appln. No. 200980127473.5.
Notice of Allowance dated Oct. 28, 2013 for U.S. Appl. No. 13/535,225.

* cited by examiner

METHOD AND SYSTEM FOR MODEL-BASED DESIGN AND LAYOUT OF AN INTEGRATED CIRCUIT

CROSS REFERENCE TO RELATED APPLICATION(S)

This application is a divisional application of U.S. patent application Ser. No. 12/133,563, now U.S. Pat. No. 8,381,152, filed on Jun. 5, 2008 and entitled "METHOD AND SYSTEM FOR MODEL-BASED DESIGN AND LAYOUT OF AN INTEGRATED CIRCUIT". This application is also cross related to U.S. patent application Ser. No. 13/535,225 filed concurrently with the instant application and entitled "METHOD AND SYSTEM FOR MODEL-BASED DESIGN AND LAYOUT OF AN INTEGRATED CIRCUIT". The content of both U.S. patent applications is hereby expressly incorporated by reference for its entirety for all purposes.

BACKGROUND AND SUMMARY

The invention is directed to a more efficient approach for hotspot detection, for implementing layout, and for placement, routing, and verification of integrated circuit designs.

A semiconductor integrated circuit (IC) has a large number of electronic components, such as transistors, logic gates, diodes, wires, etc., that are fabricated by forming layers of different materials and of different geometric shapes on various regions of a silicon wafer.

The various components of an integrated circuit are initially defined by their functional operations and relevant inputs and outputs. From the HDL or other high level description, the actual logic cell implementation is typically determined by logic synthesis, which converts the functional description of the circuit into a specific circuit implementation.

An integrated circuit designer may use a set of EDA application programs to create a physical integrated circuit design layout from a logical circuit design. The EDA application uses geometric shapes of different materials to create the various electrical components on an integrated circuit and to represent electronic and circuit IC components as geometric objects with varying shapes and sizes. During this process, the design components are "placed" (i.e., given specific coordinate locations in the circuit layout) and "routed" (i.e., wired or connected together according to the designer's circuit definitions).

After an integrated circuit designer has created the circuit layout, verification and/or optimization operations are performed on the integrated circuit layout using a set of EDA testing and analysis tools. These actions are performed since significant variations from the as-designed IC product may occur to the as-manufactured IC product due to the optical and/or chemical nature of the processing used to manufacture the integrated circuit. For example, optical distortions during the lithography process may cause variations in feature dimensions (e.g. line widths) that are patterned using masks. Physical verification would occur to help identify areas of significant risks for problematic variations. Design optimization approaches, such as OPC (optical proximity correction) and RET (resolution enhancement techniques) could be used to create an as-manufactured product that more closely matches the configuration of the as-designed layout.

The design rule check (DRC) process has long been used to help minimize manufacturing problems, by ensuring that the circuit design abides by a set of detailed rules and parameters that the foundry specifies for its manufacturing process. Essentially, each rule is associated with one or more parameter values that are checked for compliance with the rule. The DRC process will check those parameters to produce a simple "yes" or "no" answer as to whether the rule has been violated. For example, a very common rule is to check for minimum spacing between objects in a layout. DRC processing will determine whether all objects meet the minimum spacing requirements. If all objects meet the spacing requirements, then the layout meet the rules requirement for spacing. If any objects are spaced closer together than the minimum spacing requirement, then a rules violation will be identified. If there are any rules violations, then the layout will need to be modified to correct the rules violation. If no rules violations have been identified, then the IC design is passed to the next design stage for manufacturing.

DRC tools typically read and manipulate a design database which stores information about device geometries and connectivity. Because compliance with design rules generally constitutes the gating factor between one stage of the design and the next, DRC tools are typically executed multiple times during the evolution of the design and contribute significantly to the project's critical path. Therefore, reducing DRC tool execution time makes a major contribution to the reduction of overall design cycle times. In addition, DRC rules often contain design constraints that are much more limiting than are needed for any particular design or portion of a design. DRC rules are often set at the "lowest common denominator" level to ensure that most or all IC designs will properly operate. However, certain IC design may actually need parameters that are more or less cautious than other designs. Since DRC rules typically operate on an "all or nothing" basis, this means that many IC design may fail DRC processing even though they would function properly for intended purposes if manufactured. Further, manufacturing an IC design has gotten steadily more difficult, so much so that certain 2D configurations of geometry may not function properly, even though they satisfy all the DRC rules.

To address this issue, model-based approaches can be used to verify the circuit design, by using the model to check the design for manufacturing-induced problems. As used herein, the term "model" refers to a set of data that identifies one or more specific characteristics within an IC layout and data relating to its effect, manufacturability, and/or usability. A lithography model is a common example of a type of model that is used by EDA tools during many phases of the electronic design process, such as physical design, implementation, and verification.

FIG. 1 illustrates one approach for performing model-based verification and optimization in the context of routing. This approach begins with a pre-routed design 102 having a set of geometric circuit elements/shapes created with a layout tool. A routing tool would then be used for implementing interconnect elements on the layout to create a routed design 104. The conventional router does not have knowledge of lithography issues. As a result, the routed design may contain numerous layout portions that are problematic once manufacturing is performed, and would contribute to yield or functionality problems.

During the verification/optimization, models (such as lithography models) are used by a lithography simulation device 106 to predict the as-manufactured product that would result from processing the layout in a given manufacturing facility and using a given set of processing equipment and parameters. Optimizations, such as RET optimizations, may also be performed to increase the likelihood of a manufacturable design. If problems are identified, then the design may return for re-routing to correct the identified problems. Numerous iterations of this process may occur before a design is finalized. The term RET (reticle enhancement technology), as used here, includes the use of optical proximity correction (OPC), sub-resolution assist features (SRAF), phase shift masks (PSM), etc.

The problem with this approach is that lithography simulation and RET optimization is very resource intensive, requiring large quantities of both time and computing assets for adequate results. As the quantity of data in modern IC designs become larger and larger over time, the resources required for performing model-based verification and optimization upon these IC designs also becomes much greater. This problem is exacerbated by constantly improving IC manufacturing technologies that can create IC chips at ever-smaller feature sizes, which allows increasingly greater quantities of transistors to be placed within the same chip area, resulting in more complex physical and lithographic effects during manufacture.

To address these problems, among others, the present invention in some embodiments provides an approach for allowing EDA tools to implement very efficient approaches to allow the tools to directly address the effects of manufacturing processes, e.g., to identify and prevent problems caused by lithography processing. Fast models and pattern checking are employed to integrate lithography and manufacturing aware processes within EDA tools such as routers. In some embodiments, this approach avoids the rigid requirement of conventional tools that rely exclusively upon rule checks, avoiding the need to create overly complex rules that may or may not accurately reflect the real-world manufacturing problems that may occur to the design. This also avoids the need to hardcode the EDA tool (e.g., modify the router software) to explicitly target particular bad patterns, which significantly reduces or eliminates the need to perform this highly manual and error-prone effort. Moreover, this approach in some embodiments can also be used to avoid the very slow process of using external tools to verify the routed design and to provide feedback to the router. In this context, the external tool will often call the problems it finds "hotspots".

DETAILED DESCRIPTION

The present approach is directed to an improved method, system, and computer readable medium for performing routing, full chip flows, and "hotspot" detection. As used herein, the term "hotspot" refers to a portion of a design layout that is identified as corresponding to a manufacturing-related problem, such as may be caused by lithography, chemical metal polishing (CMP), etch, strain, critical area analysis, or any combination thereof. Some embodiments of the invention utilize pattern matching to detect hotspots and to provide lithographically aware routing and chip design, by creating and accessing a bad pattern library. The term "bad pattern", according to some embodiments, refers to any layout shape or shape pattern that has a negative impact on yield or functionality due to, for example, lithography, CMP, strain, critical area analysis, and other manufacturing related issues. In this document, the term "hotspot" may be used in certain places synonymously with the term "bad pattern."

To illustrate embodiments of the invention and their advantages, this document will illustrate its teachings particularly with respect to routers. It is noted, however, that the invention may be applied in other contexts as well and will be applicable to other classes of design/verification/optimization tools.

Figure 1:
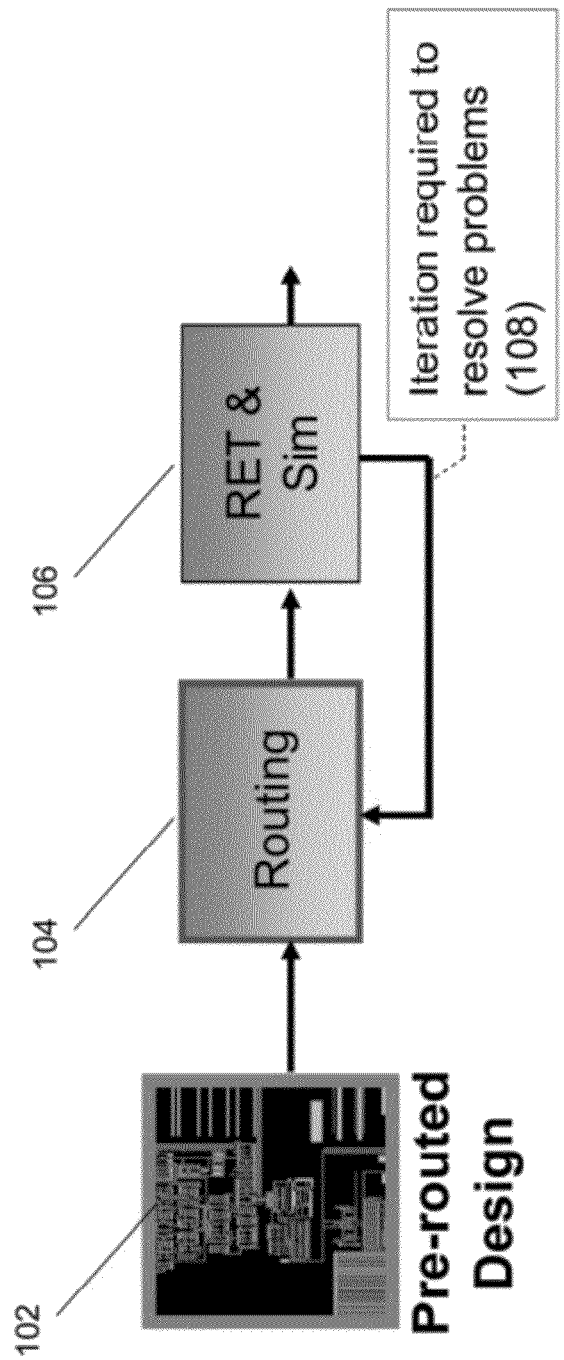
FIG. 1 shows a flow of routing processing with lithography simulation.
Figure 2:
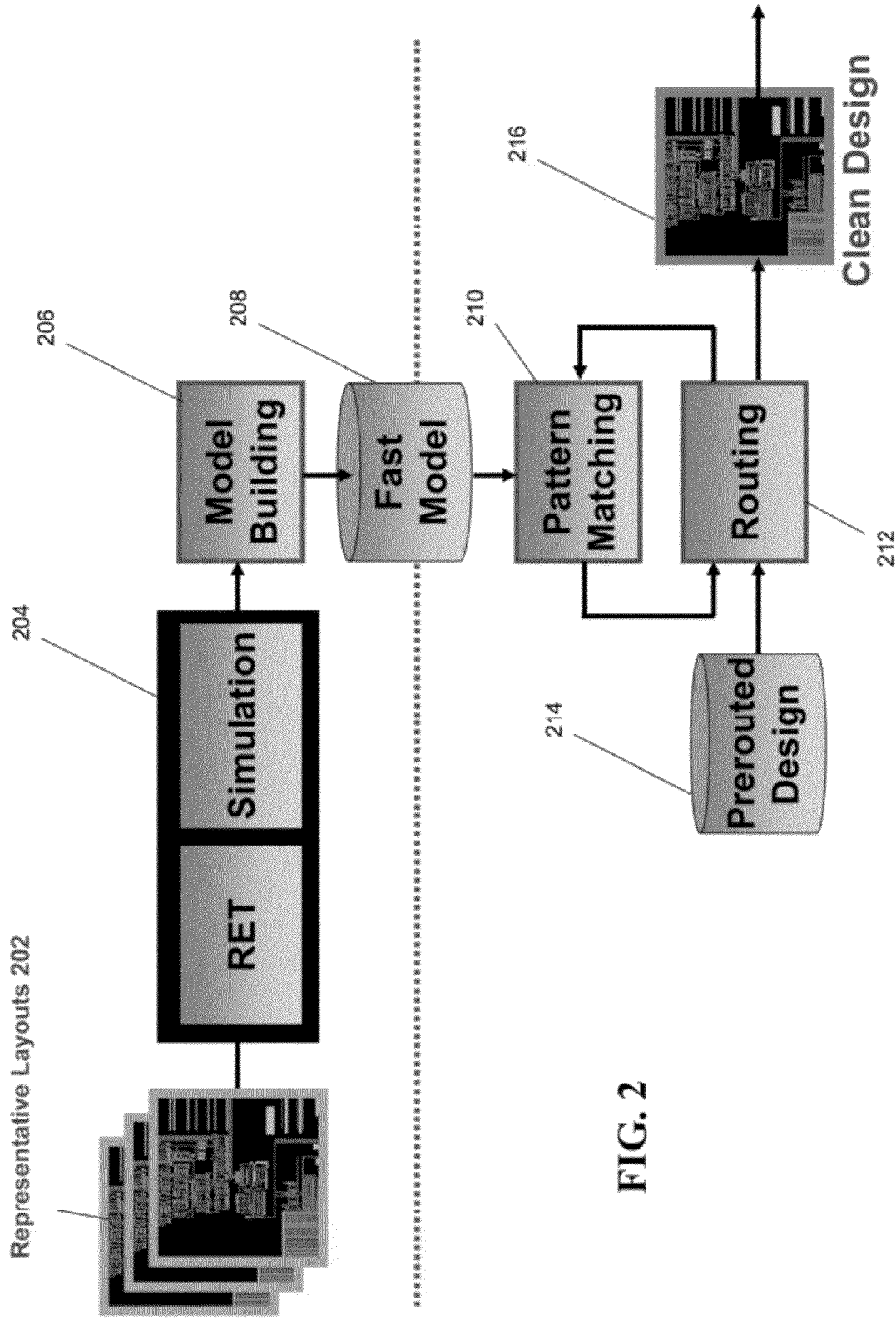
FIG. 2 shows fast models and pattern matching integrated into a router flow, according to some embodiments of the invention.

FIG. 2 shows a general approach for implementing some embodiments of the invention. The top portion of this figure describes a process for generating a fast model that can be used to identify hotspots and/or to route a circuit design. The bottom portion of the figure describes a process for routing a clean design that would be free of known hotspots, either in its entirety or to a substantial extent.

The model building portion of the approach begins by receiving a representative layout 202 for analysis. In some embodiments, the representative layout 202 can be, for example, test chips that are created parametrically, created by the router, chosen by designers, or selected by other means. The representative layout 202 is meant to be representative of actual design to be routed at a later point.

The user's golden flow 204 is then used to perform model building 206 to create a library/database 208 of fast models. Model building for fast models can be performed by executing layout optimization and simulation upon the representative layout 202, such as by performing lithography simulation using the customer's expected manufacturing facility and process parameters to predict the as-manufactured result based upon the representative layout 202. The user's RET tools and configurations may also be used to optimize and predict the manufactured result of the layout configuration. The term RET (reticle enhancement technology), as used here, includes the use of, for example, optical proximity correction (OPC), sub-resolution assist features (SRAF), phase shift masks (PSM), etc. The results of the simulation 204 are used to identify patterns within the design. The bad patterns would correspond to areas of the design that are likely to result in yield or functionality problems that are induced by the manufacturing process. Fast models in the form of fast pattern models can be maintained to store information about the identified patterns.

According to some embodiments, the fast model, e.g., the fast pattern model, comprises a search structure corresponding to patterns, where a pattern is presented to the fast model and a result is retrieved. This type of search can be exact or inexact. A simple exact fast model can be created using a hash table. A tree (or prefix tree) is an ordered tree data structure that can be used for fast exact and inexact search. A neural net can also be trained to do a fast inexact search and can predict values not previously seen.

A library or database 208 of fast models is then built based on these patterns. The library/database 208 provides a cache of known simulation results and identifies whether or not certain patterns are hotspots. In some embodiments, only information about hotspots/bad patterns is maintained in the library/database 208. In an alternate embodiment, both known good patterns as well as known bad patterns are maintained in the library/database 208. The advantage of a database that only includes bad patterns is that it is likely to be a smaller database, which is therefore faster to search and less of a drain upon system resources. In some embodiments, the library/database 208 can interpolate from among the known hotspots to predict variations of known hotspots. In some embodiments, only known good patterns are kept in the library/database 208.

According to one specific embodiment, the library/database 208 implements the fast models in the form of stored patterns. The patterns stored in the library/database 208 correspond to particular combinations of shapes and patterns that appear in the layout. The patterns may also be associated with an indication of the whether the pattern is a good pattern or a bad pattern.

As noted above, the bottom portion of FIG. 2 describes a process for routing a clean design to be free of known hotspots. A pre-route design 214 is received to undergo the process. Routing is performed at 212. Pattern matching 210 is performed to quickly look up known and interpolated hotspots from the library/database 208 of hotspots. One suitable approach that can be taken to perform pattern matching is described in U.S. patent application Ser. No. 11/609,901, now U.S. Pat. No. 7,818,707, filed on Dec. 12, 2006, and entitled "Fast Pattern Matching", which is hereby incorporated by reference in its entirety.

In practice, this process operates by having the router identify one or more proposed routing configurations for portions of the layout. Pattern matching is performed to determine whether the proposed routing configuration matches a known bad pattern from the database 208. If the pattern-matching identifies a hotspot within the proposed routing configuration, then that problematic hotspot can be corrected by modifying the proposed routing configuration to an alternate routing configuration that does not match up to a bad pattern. Alternatively, the router can simply select a known good pattern from the library to implement a routing configuration. Once all hotspots have been addressed, the cleanly routed design 216 can be output for further processing for the next stage of the design process.

There are numerous advantages to this type of inventive approach. For example, this approach is much faster, since pattern matching can be a much faster operation than actually performing simulation. Moreover, this approach provides a much more accurate result. This is because other non-simulation approaches use various shortcuts to compute a result. These shortcuts can be characterized as performing an inaccurate simulation, including an approximation of the effects of RET/OPC. The shortcut non-simulation approach is inaccurate because, for example, it is not thorough enough with regards to non-lithography effects. The present embodiment caches known simulation results using a golden RET/OPC and simulation process to provide results that are at or almost as accurate as performing the simulation on the design itself.

In addition, the proposed solution can be directly integrated into the routing tool. Alternate approaches involve a loose combination of tools where the equivalent step of returning hotspot scores is done via an external tool. The present embodiment can be configured to actually integrate pattern checking into the inner loop of the router itself so that the output of the routing step is a layout that is hotspot clean.

Moreover, the present embodiment can be configured to natively operate with 2-dimensional (2D) patterns. Bad 2-dimensional patterns are typically very difficult to describe using scripts or by writing code. This embodiment can effectively handle 2-dimensional patterns natively as a 2-dimensional representation.

While the previous description has focused on a routing application, the same approach can be used for any design-side layout verification. For example, the inventive approach can be used to speed up any current flow that involves hotspot detection.

Figure 3:
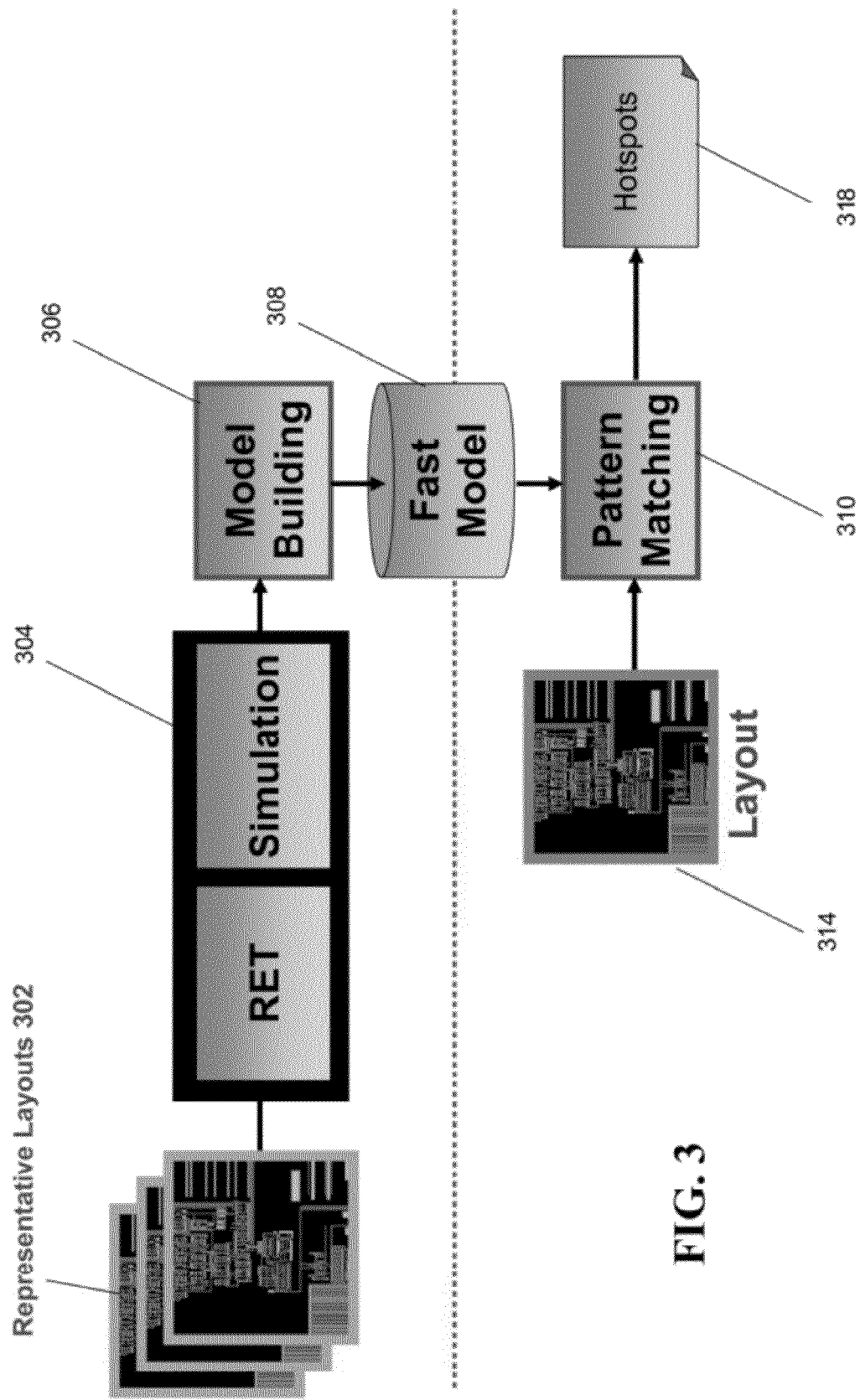
FIG. 3 shows fast models and pattern matching generally used for a chip flow, according to some embodiments of the invention.

One example application is for full-chip hotspot detection, as illustrated in FIG. 3. The top portion of this figure describes a process for model building, which can use the same actions and mechanisms described with respect to FIG. 2, in which a representative layout 302 is received for analysis. The user's golden flow 304 is then used to perform model building 306 to create a library/database 308 of fast models. The results of the simulation 304 are used to identify patterns within the design. The bad patterns would correspond to areas of the design that are likely to result in yield or functionality problems that are induced by the manufacturing process. A library or database 308 of fast models is then built based on these patterns. The library/database provides a cache of known simulation results and identifies whether or not certain patterns are hotspots. The library/database 308 may implement the fast models in the form of stored patterns. The patterns stored in the library/database 308 correspond to particular combinations of shapes and patterns that appear in the layout. The patterns may also be associated with an indication of the whether the pattern is a good pattern or a bad pattern.

Unlike FIG. 2, the approach of FIG. 3 does not necessarily employ a tight integration into a router to perform fast incremental checks on the configurations that the router is processing. Instead, the layout input 314 can be any or all of the chip design, including a full-chip check, which is used for any portions of the design flow. Therefore, the input 314 to the pattern matching action 310 can be an entire layout, or could be a smaller portion of the full chip.

Pattern matching 310 is performed to determine whether the layout portion under examination matches a known bad pattern from the database 308. If the pattern-matching identifies a match to a known bad pattern, then a determination is made of the existence of a hotspot within the proposed layout. The output 318 of this process, according to some embodiments, is the location and/or severity of hotspots that have been found in the layout.

Figure 4:
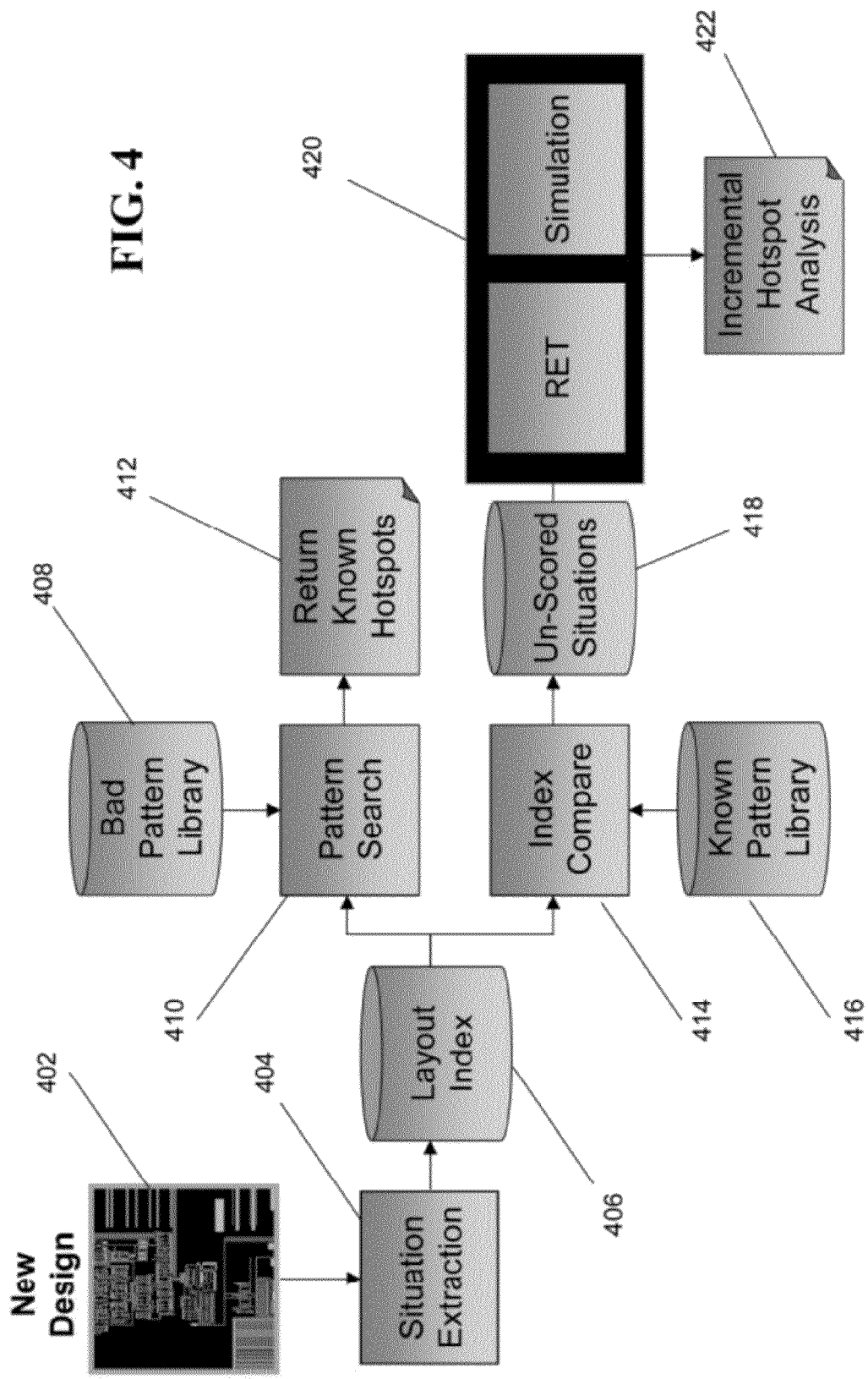
FIG. 4 shows an approach for implementing hotspot analysis, according to some embodiments of the invention.

FIG. 4 shows an example full or partial chip hotspot analysis application flow according to some embodiments of the invention. In this flow, a layout design 402 is received for analysis.

The design 402 undergoes situation extraction at 404. The goal of situation extraction, also referred to as pattern extraction, is to reduce the layout into a set of patterns that has a reasonably good coverage over the design. According to one approach, this action decomposes the layout into the geometric primitives that exist in the design, e.g., the basis or unique patterns in the layout. The choices associated with this decomposition (the situation semantics) fall into, for example, three areas: anchor, radius, and canonicalization. A different set of choices will result in a different choice of basis patterns.

Suitable potential anchors include, for example: (a) layout corners; (b) simulation cutlines; (c) subset of the simulation cutlines, such as ends of the cutlines, middle of the cutlines, etc; (d) along edges; (e) along the center line of polygons; and/or (f) everywhere.

Suitable choices of radius include, for example: (a) at the optical radius (e.g., about 1.2 um); (b) something smaller to reduce the data volume; and/or (c) at multiple radii—for instance, a simple two radii option might use the optical radius (for best coverage) and a smaller radii. The data within the smaller radii might be preserved in greater detail than the data between the smaller radii and the optical radius (for which some very lossy transformation may be applied).

Canonicalization is the process of converting data that has more than one possible representation into a "standard" canonical representation; for instance, patterns that are equivalent except for a 90 degree rotation can be folded together into one canonical representation. Some suitable choices of canonicalization include, for example: (a) rotational; (b) mirror; (c) translational; and/or (d) lossy transform. An example of a suitable lossy transform is a Gaussian filter. If the same filter is applied to all patterns, patterns that are identical after this filter are folded together. In some embodiments, a filter is applied that approximates the behavior of the lithography system.

One suitable approach that can be taken to perform situation extraction is described in U.S. patent application Ser. No. 11/207,267, now U.S. Pat. No. 7,418,693, filed on Aug. 18, 2005, and entitled "System and Method for Analysis and Transformation of Layouts Using Situations", which is hereby incorporated by reference in its entirety.

Multiple situations may overlap based upon the configuration of shapes within the situation. This is because the situation extraction may proceed to a large number of locations, e.g., corners in the design, where adjacent corners may give rise to adjacent situations that share regions that are the same or similar. According to some embodiments, these same or similar regions can be collapsed into the same entry within a pattern database. These overlapping regions can then be simulated as a group, rather than separate simulations for each pattern.

A layout index 406 can be maintained for the identified patterns from the design(s). In some embodiments, the layout index 406 provides an alternate representation of the designs that include the extracted situations plus information about where the situations are instantiated within the design.

The situations within the layout index 406 will then undergo pattern matching 410 against a database 408 of bad patterns. If the pattern-matching 410 identifies a match to a known bad pattern, then a determination is made of the existence of a hotspot within the design. The output 412 of the process is information about the identified hotspots, including for example, the location and/or severity of the identified hotspots.

As noted above, some embodiments of the invention can maintain a database 416 of good patterns in addition to, or instead of, the database 408 of bad patterns. The same or similar flows can be used to store patterns that have been validated as clean. The pattern matching process can be used to retrieve only good patterns that a router or other design tool is permitted to employ.

In the present flow, an index comparison action 414 is used to identify whether any of the extracted situations correspond to a known good pattern from the good pattern database 416. In some embodiments, the good pattern database 416 is maintained using a hashing function that hashes the good pattern to an entry within the database 416. The index comparison action 414 would then be implemented by hashing the situation under examination to the database to check for a match. If the hash function is appropriately defined, and collisions are minimized, then in some embodiments, the geometric patterns themselves do not need to be maintained. Instead, only the hash signature is maintained in the database 416. To optimize memory usage and efficiencies, the known pattern library 416 could be split onto multiple nodes or processing machines.

Any situations that have not been identified by this point could be considered "unscored" situations 418. These would be patterns and configurations for which it is unknown whether they represent good or bad patterns. These situations would undergo simulation and RET optimization 420 to determine whether or not any would be considered hotspots. The output is an incremental hotspot analysis 422 of the design.

In some embodiments, the situations from 418 could be re-tiled back into the original layout location to reduce the total area that is needed, e.g., to reduce resource consumption of the described process. As described earlier, situations may overlap and it may be advantageous to perform the described process on a group of situations that share geometry as a single region rather than individually on each situation.

Figure 5:
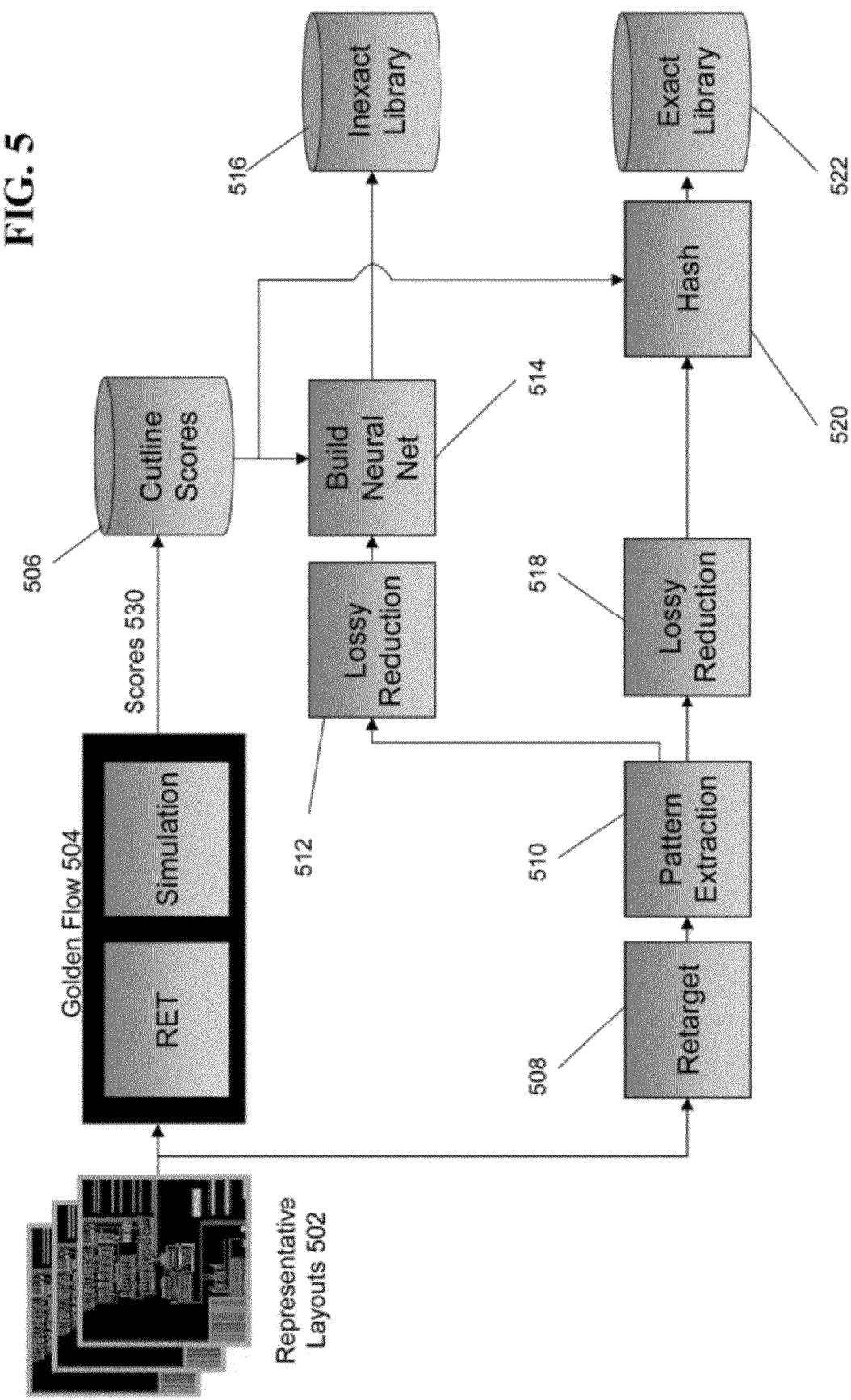
FIGS. 5, 7, and 9 show a model building flows, according to some embodiments of the invention.

FIG. 5 shows a possible implementation of a model building flow according to some embodiments of the invention. The purpose of this flow is to generate a database of patterns that can be used for pattern checking. The flow of FIG. 5 begins by receiving a representative layout 502 for processing. In some embodiments, the representative layouts 502 comprise known designs that can be run through a user's golden simulation/optimization flow 504.

The output from the simulation/optimization action 504 is a set of scores 530 for patterns within the layout. A score represents a quantitative or qualitative value that represents the degree of manufacturability or usability associated with the pattern. Instead of just having a "yes" or "no" value associated with the existence of a hotspot, the score value can be used to identify the degree of severity of a given pattern or hotspot.

For the present flow, all scores 530 for the patterns are provided from the golden flow 504—regardless of whether they relate to "good" patterns or "bad" patterns. This means that the libraries that will be generated from this process will include patterns that both correspond to hotspots as well as patterns that are not associated with hotspots. Other flows will be discussed below, such as the flow of FIG. 7, which can be used to create libraries that contain only hotspot scores. Other flows may contain only "good" patterns.

Cutline scores 506 would be generated for cutlines within the layout. A cutline corresponds to a measurement location/point within the layout. The cutline score would be scores that correspond directly to the cutline locations. In alternate embodiments, the scores are based upon non-cutline locations, such as points, edges, rectangles, or markers.

As described below, a set of patterns or situations is generated for analysis. The patterns are used in combination with the cutline scores 506 to generate a library 516 of "inexact" patterns. One possible approach is to build a neural net 514 to generate the library 516 using conventional neural net techniques known to those skilled in the art. The library 516 includes scores for the patterns represented in the library.

The representative layouts 502 could also be used in a re-targeting action 508. Re-targeting is employed in the present embodiment to generate a set of patterns that forms an exact match library 522 of hotspot patterns. Unlike the inexact library 516, the exact match library 522 definitively states whether a given pattern corresponds to an entry in the library 522. In contrast, the inexact library 516 has entries that may correspond to multiple patterns, e.g., based upon a neural net algorithm.

The re-targeting action 508 can also be used in some sense to "mimic" or recreate the results of the user's golden flow 504 by attempting to replicate the processing and simulation results from the golden flow 504. This is particularly useful if the golden flow 504 is implemented by a tool whose internal operation is unknown or confidential, e.g., a tool that is provided by a first tool vendor different from a second tool vendor providing the tool that is performing the re-targeting action. In some embodiments, the actual retargeted layout is available as an output from the golden flow 504 and is used directly instead of performing the action 508.

The output from the re-targeting action 508 undergoes pattern extraction 510 to extract a set of patterns or situations from the re-targeted layout. As noted above, the goal of pattern/situation extraction is to decompose the layout into the geometric primitives that exist in the design, e.g., the basis or unique patterns in the layout. The choices associated with this decomposition (the situation semantics) fall into, for example, three areas: anchor/corner, radius, and canonicalization. A different set of choices will result in a different choice of basis patterns. Suitable potential anchors include, for example, cutline locations. Suitable choices of radius include, for example, a radius up to the optical radius. Canonicalization is the process of converting data that has more than one possible representation into a "standard" canonical representation; for instance, patterns that are equivalent except for a 90 degree rotation can be folded together into one canonical representation. Some useful choices of canonicalization include, for example, rotational or mirroring.

The results of pattern extraction could very well include an excessive amount of information about the patterns in the layout. If so, then it may be appropriate to apply some sort of filtering to reduce the volume of pattern data to be processed from the layout. According to some embodiments of the invention, to reduce the volume of data and to improve the grouping of "similar" patterns, a lossy transform 512/518 can be applied to the patterns. Some choices of actions to perform the lossy transform, include for example: (a) radon transforms; (b) Gaussian transforms; (c) weighted moments; and/or (d) principal components analysis.

The scores 530/506 and the extracted patterns are used to generate the fast model library 522. According to some embodiments, the fast model comprises a search structure corresponding to patterns, where a pattern is presented to the fast model and a result is retrieved. An exact fast model can be created using a hash table where an hash function is employed to hash to specific entries based upon the score and/or pattern. In some embodiments, only the hash signatures are maintained and the actual geometries are discarded. In an alternate embodiment, the hash signatures and the geometries are both maintained in the library. The hash can also be used to return a score for the marker.

Figure 6:
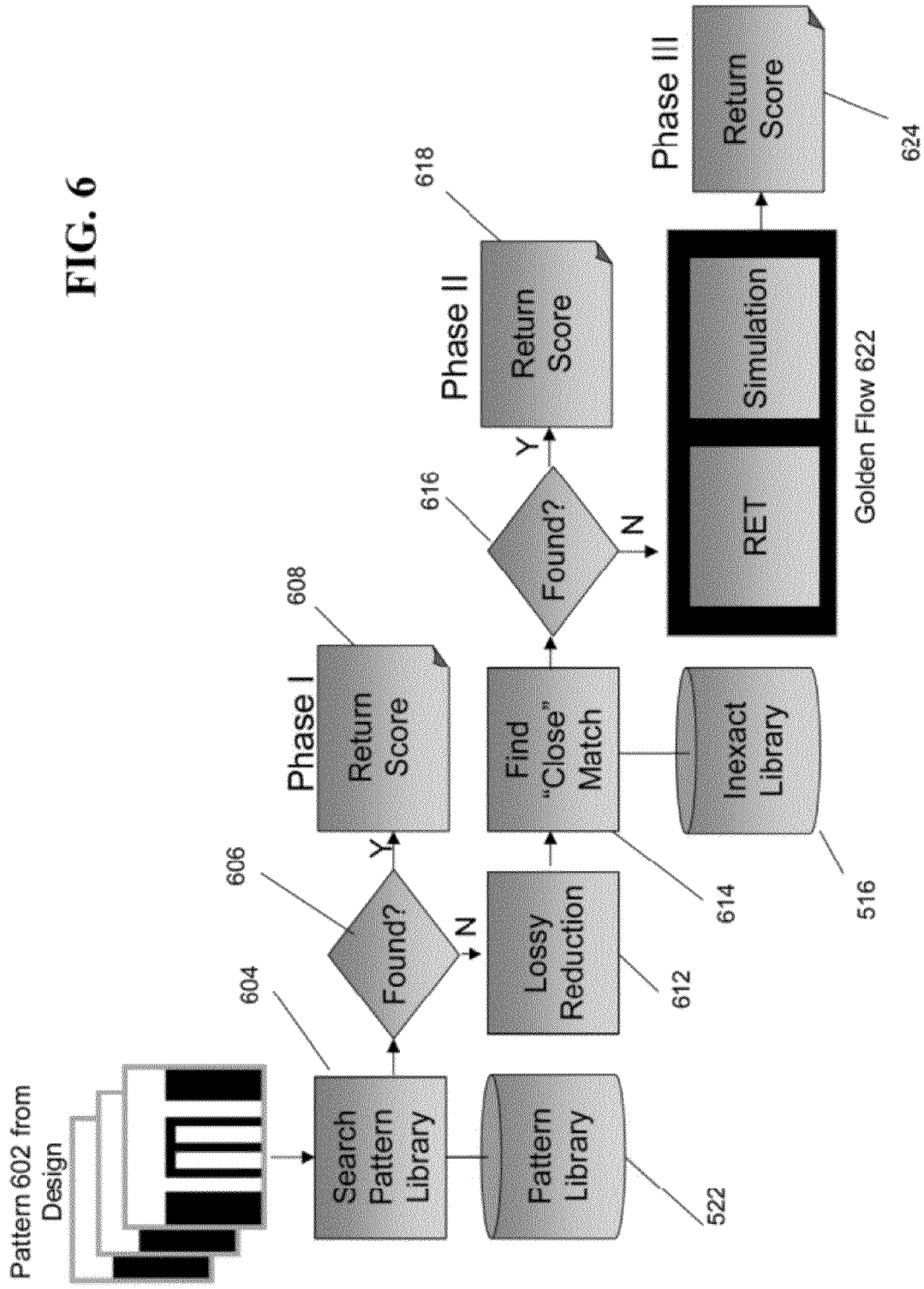
FIGS. 6, 8, and 10 show flows for performing analysis based upon models, according to some embodiments of the invention.

FIG. 6 shows a pattern matching flow according to one embodiment of the invention, e.g., to utilize the models generated by the process of FIG. 5. A given pattern 602 from the design under examination is received as input to this process. At 604, the pattern 602 is compared against the exact library 522 to determine if an exact match is found against the patterns in the library 522. If the pattern 602 is found in the library 522, then the score for that pattern is returned at 608.

If the pattern 602 is not found in the exact library 522, then the next step is to determine if a match can be found in the inexact library 516. Lossy reduction 612 is performed to determine whether multiple patterns may correspond to the same category or entry within the inexact library 516. As noted above, there are numerous loss reduction techniques that could be employed, including for example: (a) radon transforms; (b) Gaussian filtering; (c) weighted moments; and/or (d) principal components analysis. In some embodiments, some or all of the lossy reductions actions 512, 518, and 612 are the same.

A determination is made at 614 whether a close match can be found to the pattern 602 within the inexact library 516. If a close enough match is found, 616, then at 618, the score for the pattern entry in the inexact library 516 for the close match is returned as the score for the pattern.

If no patterns within the inexact library 516 are close enough, then the golden flow 622 of the user's simulation/optimization actions is performed to generate a new score 624 for the pattern 602. A feedback loop can be implemented to update the libraries 516 and 522 with the score 624 for the pattern 602.

It is noted that while Phase I, Phase II, and Phase III are described sequentially, these phases can occur in parallel in various embodiments of the invention.

Figure 7:
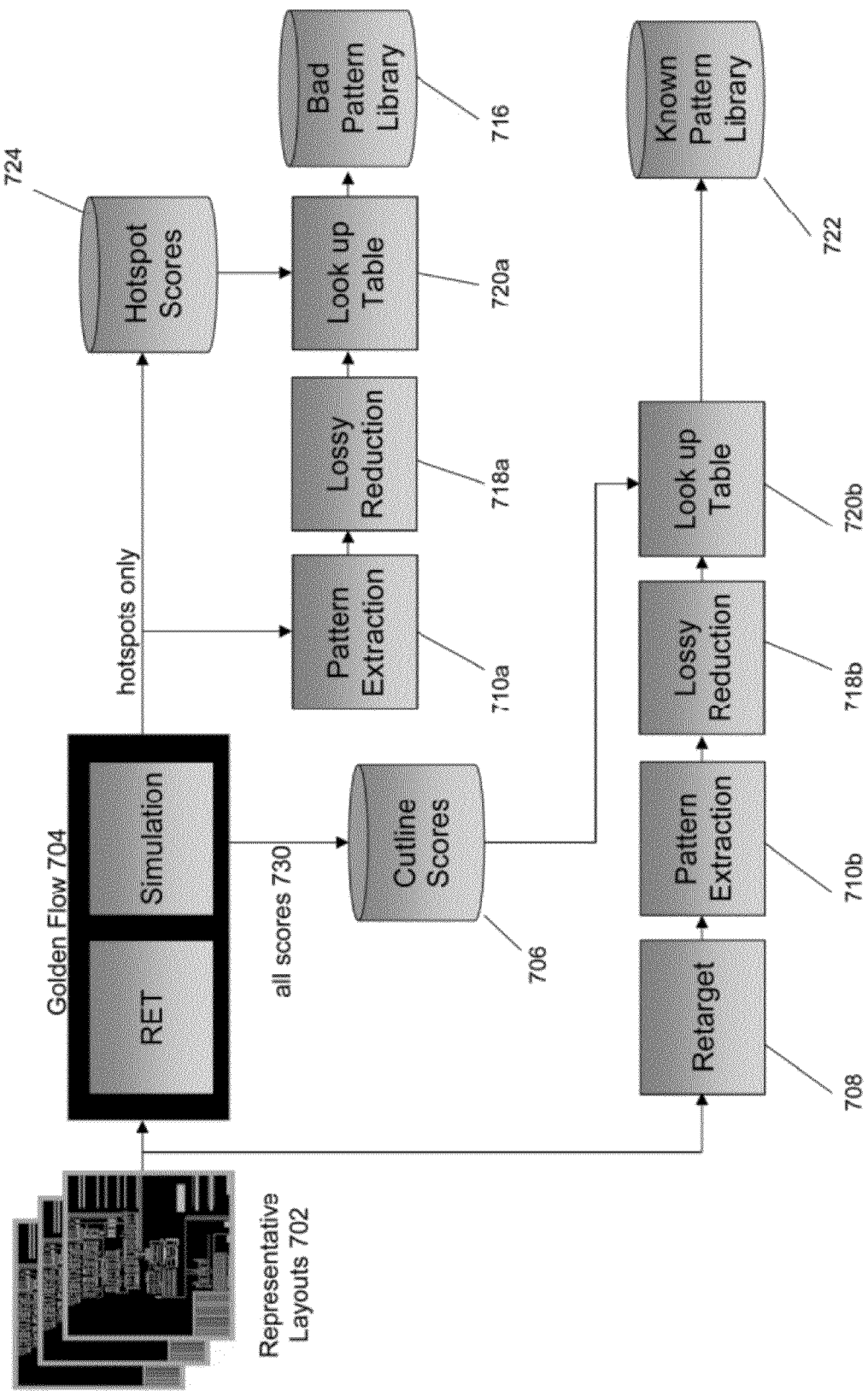

FIG. 7 shows another possible implementation of a model building flow according to some embodiments of the invention. Unlike the flow of FIG. 5, model building flow of FIG. 7 will create one or more libraries that separate out the bad patterns from the other patterns. The flow of FIG. 7 begins by receiving a representative layout 702 for processing. In some embodiments, the representative layouts 702 comprise known designs that can be run through a user's golden simulation/optimization flow 704.

Along a first path, the output from the simulation/optimization action 704 is a set of scores 724 that correspond only to hotspots within the representative layouts 702. Along a second path, the output from the simulation/optimization action 704 is a set of all scores 730 for from the layout, regardless of whether or not they correspond to a hotspot. Cutline scores 706 are generated for cutlines within the layout based upon the scores 730.

A set of patterns/situations is generated for analysis using pattern/situation extraction 710a. The choices associated with this decomposition (the situation semantics) fall into, for example, three areas: anchor/corner, radius, and canonicalization. A different set of choices will result in a different choice of basis patterns. Suitable potential anchors include, for example, any deterministic approaches or techniques. Suitable choices of radius include, for example, anything up to an optical radius. Suitable choices for canonicalization include, for example, pattern signature vector transformation, such as described in U.S. patent application Ser. No. 11/952, 912, now U.S. Pat. No. 7,966,586 filed on Dec. 7, 2007 and entitled "Intelligent Pattern Signature Based On Lithography Effects", which is hereby incorporated by reference in its entirety.

The patterns from pattern/situation extraction 710a may undergo a lossy reduction 718a. The results of the lossy reduction 718a are employed to create a look-up table 720a that is used to index the bad patterns in the bad pattern library 716. The bad pattern library 716 only includes entries and scores for hotspots, e.g., as identified from the representative layout 702. In operation, a match against an entry in the bad pattern library 716 would retrieve the score associated with the bad pattern.

The representative layouts 702 could also be used in a re-targeting action 708 to create a library 722 of known patterns, including both good and bad patterns. As described above, the re-targeting action 708 can be used to mimic or recreate the results of the user's golden flow 704. The output from the re-targeting action 708 undergoes pattern extraction 710b to extract a set of patterns or situations from the re-targeted layout. As noted above, the goal of pattern/situation extraction is to decompose the layout into the geometric primitives that exist in the design, e.g., the basis or unique patterns in the layout. The choices associated with this decomposition (the situation semantics) fall into, for example, three areas: anchor/corner, radius, and canonicalization. A different set of choices will result in a different choice of basis patterns. Suitable potential anchors include, for example, anchoring based upon edges. Suitable choices of radius include, for example, the optical radius or some fraction of the optical radius. Suitable choices for canonicalization include, for example, a lossy transformation where a central core region at a small radius is stored exactly, but a Gaussian filter is applied at a radius outside of the core region. In some embodiments, the actual retargeted layout is available as an output from the golden flow 704 and is used directly instead of performing the action 708.

The patterns from pattern/situation extraction 710b may undergo a lossy reduction 718b. The results of the lossy reduction 718b are employed to create a look-up table 720b that is used to index the known patterns in the known pattern library 722. The known pattern library 722 includes entries and scores for the all known patterns, e.g., as identified from the representative layout 702. In operation, a match against an entry in the known pattern library 722 would retrieve the score associated with the identified pattern.

Figure 8:
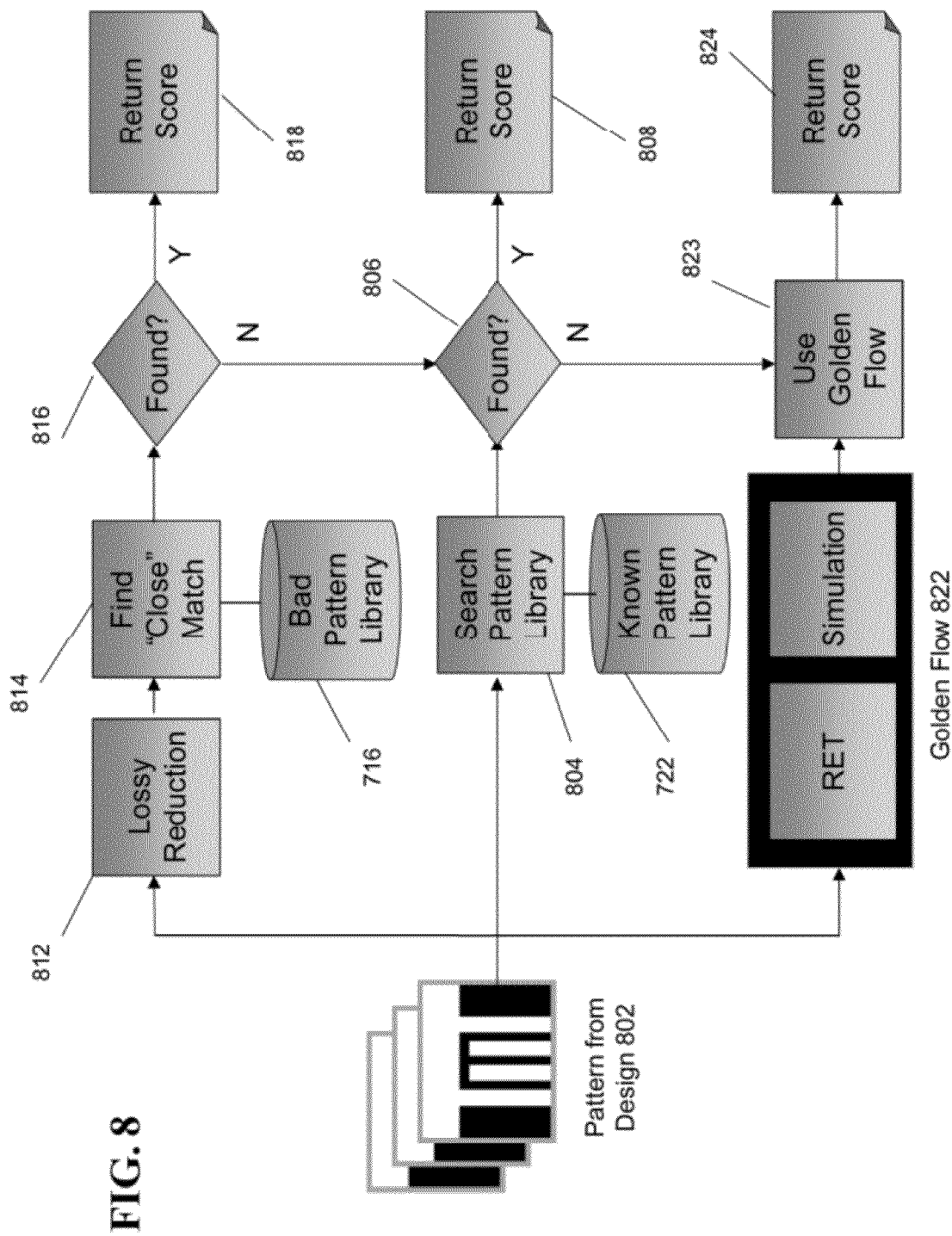

FIG. 8 shows a pattern matching flow according to one embodiment of the invention, e.g., to utilize the models generated by the process of FIG. 7. A given pattern 802 from the design under examination is received as input to this process. Lossy reduction 812 is performed to determine whether multiple patterns may correspond to the same category or entry within the bad pattern library 716. A determination is made at 814 whether a close match can be found to the pattern 802 within the entries in the bad pattern library 716. If a close enough match is found, 816, then at 818, the score for the pattern entry in the bad pattern library 716 for the close match is returned as the score for the pattern.

At 804, the pattern 802 is compared against the entries in the known pattern library 722 to determine if an exact match is found against the patterns in the known pattern library 722. If the pattern 802 is found in the library 722, then the score for that pattern is returned at 808.

Alternatively and/or if no match is found within the known pattern library 722, the golden flow 822 of the user's simulation/optimization actions is performed to generate a new score 824 for the pattern 802. A feedback loop can be implemented to update the libraries 716 and 722 with the score 824 for the pattern 802.

It is noted that while three separate processing paths are described in FIG. 8, these processing paths can occur either sequentially or in parallel.

Figure 9:
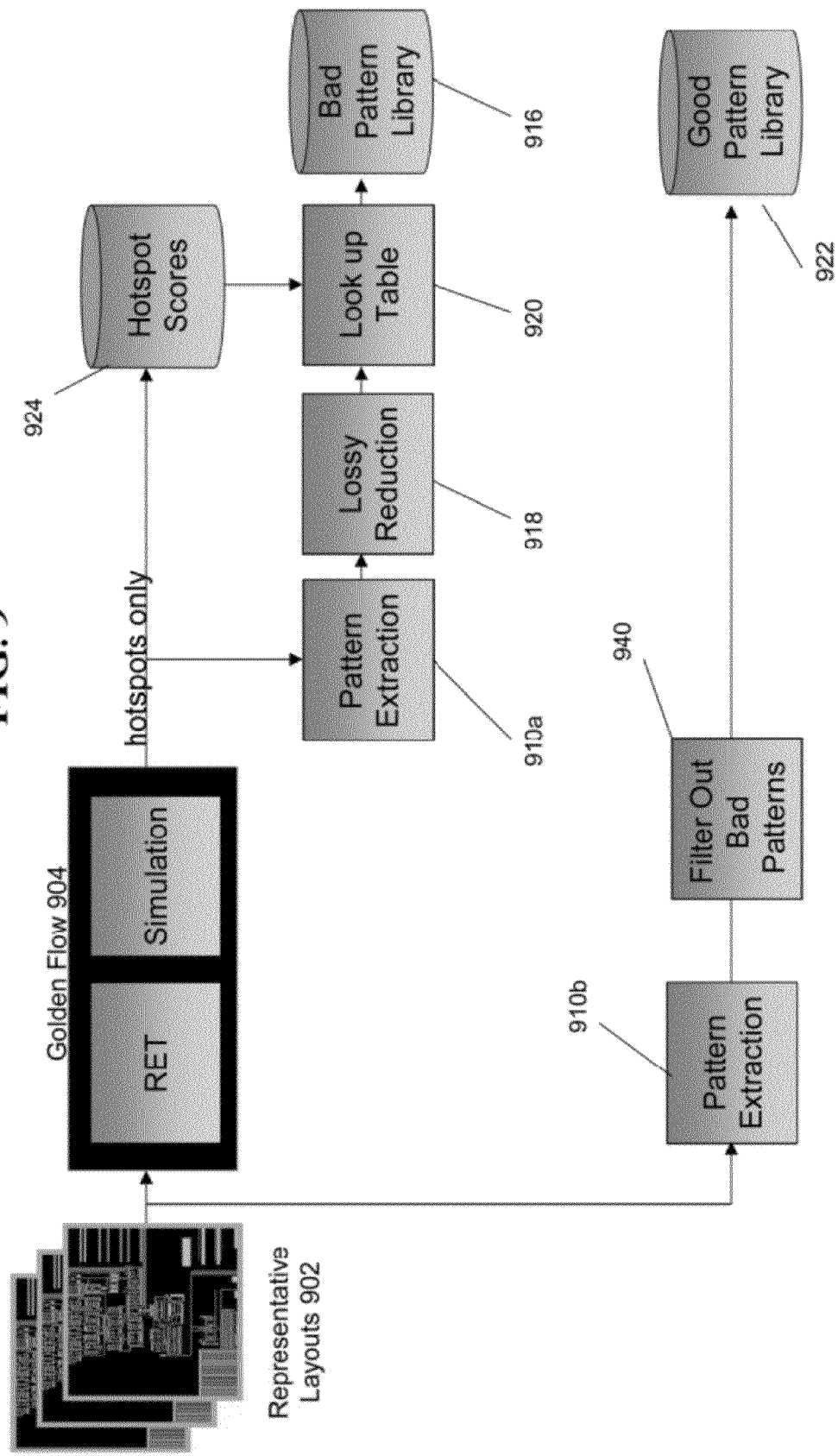

FIG. 9 shows yet another possible implementation of a model building flow according to some embodiments of the invention. Unlike the previous flows, the model building flow of FIG. 9 will create separate libraries for both the good patterns and the bad patterns. The flow of FIG. 9 begins by receiving a representative layout 902 for processing. In some embodiments, the representative layouts 902 comprise known designs that can be run through a user's golden simulation/optimization flow 904. The output from the simulation/optimization action 904 is a set of scores 924 that correspond only to hotspots within the representative layouts 902.

A set of patterns/situations is generated for analysis using pattern/situation extraction 910a. The choices associated with this decomposition (the situation semantics) fall into, for example, three areas: anchor/corner, radius, and canonicalization. A different set of choices will result in a different choice of basis patterns. Suitable potential anchors include, for example, edges in the design. Suitable choices of radius include, for example, an optical radius or some fraction of the optical radius. Suitable choices for canonicalization include, for example, translational uniquing techniques where patterns that are identical except under translation are folded together.

The patterns from pattern/situation extraction 910a may undergo a lossy reduction 918. The results of the lossy reduction 918 are employed to create a look-up table 920 that is used to index the bad patterns in the bad pattern library 916. The bad pattern library 916 includes entries and scores for hotspots, e.g., as identified from the representative layout 902, the golden flow 904, the hotspot scores 924, or the look-up table 920.

A set of patterns/situations is generated for analysis using pattern/situation extraction 910b to create a library 922 of known good patterns. The choices associated with this decomposition (the situation semantics) fall into, for example, three areas: anchor/corner, radius, and canonicalization. A different set of choices will result in a different choice of basis patterns. Suitable potential anchors include, for example, rectangles in the design. Suitable choices of radius include, for example, an optical radius or some fraction of the optical radius.

The output of the golden flow 904 can be used to filter out 940 the bad patterns, leaving only known good patterns to be stored within the known good pattern library 922.

Figure 10:
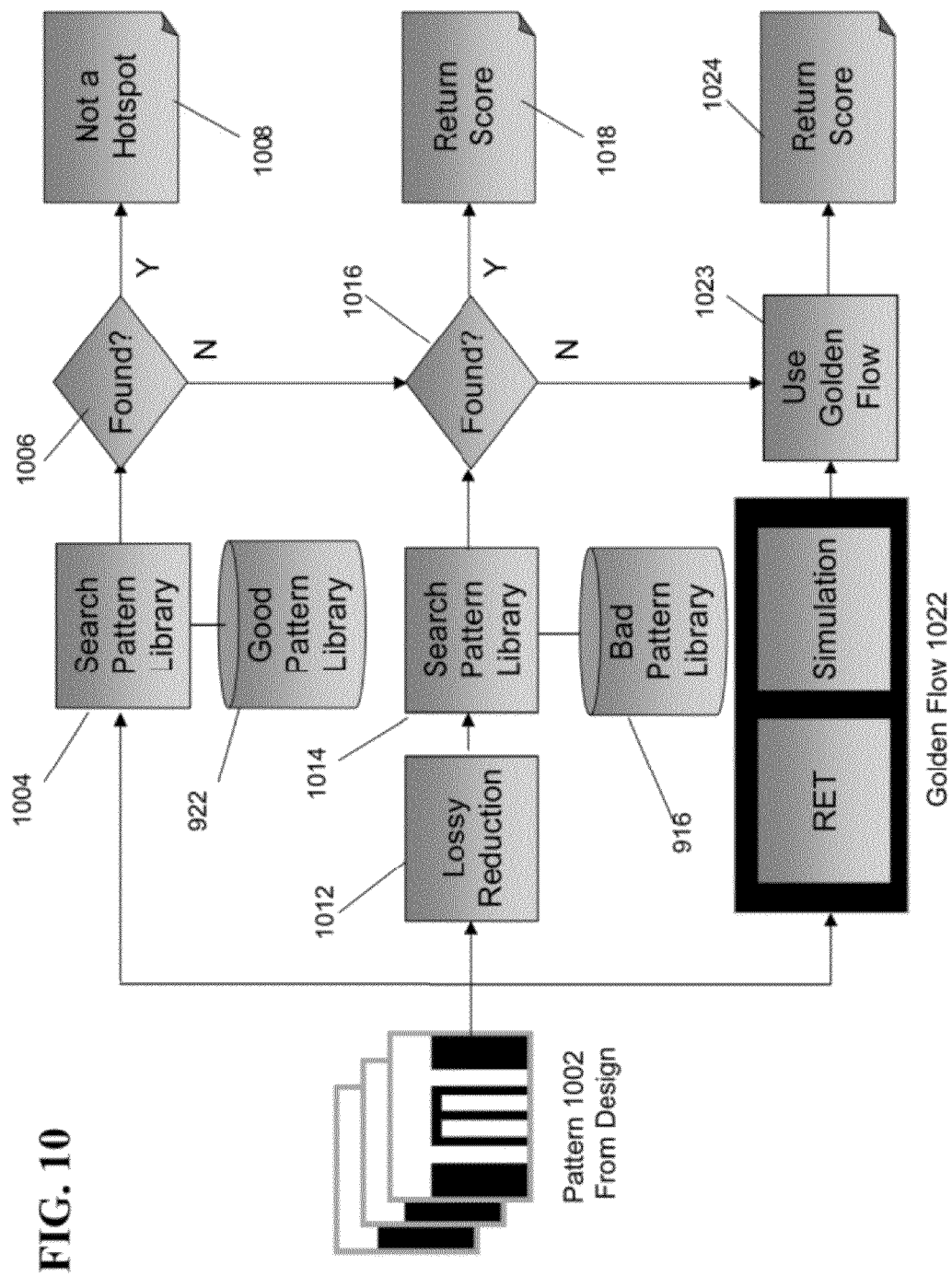

FIG. 10 shows a pattern matching flow according to one embodiment of the invention, e.g., to utilize the models generated by the process of FIG. 9. A given pattern 1002 from the design under examination is received as input to this process. At 1004, the pattern 1002 is compared against the entries in the known good pattern library 922 to determine if an exact match is found against the known good patterns in the good pattern library 922. If the pattern 1002 is found in the library 922, it is known that the pattern is not a hotspot, and a result 1008 to that effect is issued for display on a display device or stored in a computer readable medium.

Lossy reduction 1012 is performed to determine whether multiple patterns may correspond to the same category or entry within the bad pattern library 916. A determination is made at 1014 whether a close match can be found to the pattern 1002 within the entries in the bad pattern library 916. If a close enough match is found, 1016, then at 1018, the score for the pattern entry in the bad pattern library 916 for the close match is returned as the score for the pattern.

Alternatively and/or if no match is found within the known good pattern library 922 or the bad pattern library 916, then the golden flow 1022 of the user's simulation/optimization actions is performed to generate a new score 1024 for the pattern 1002. A feedback loop can be implemented to update the libraries 916 and 922 with the score 1024 for the pattern 1002. It is noted that while three separate processing paths are described in FIG. 10, these processing paths can occur either sequentially or in parallel.

Figure 11:
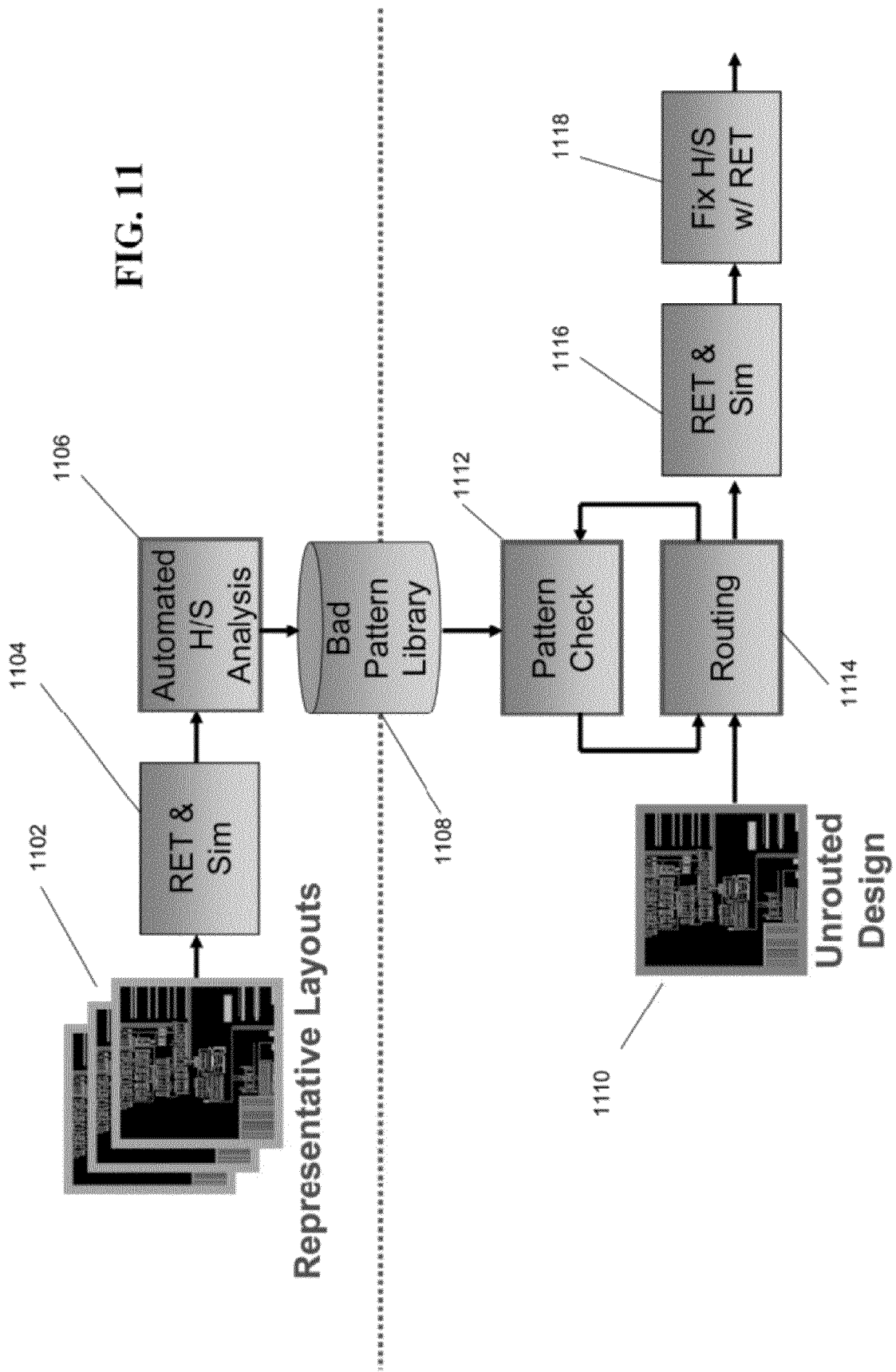
FIGS. 11-12 show approaches to improve routing using pattern matching, according to some embodiments of the invention.

FIG. 11 shows an improved routing flow that takes advantage of pattern matching to optimize designs for routing. This flow is a variation of the flow described in FIG. 2 where the fast model is a library/database of bad patterns. In this flow, the representative layouts 1102 are used, in addition to simulation and optimizations activities 1104, to perform automated hotspot detection 1106 as described above to generate a bad pattern library 1108. An un-routed design 1110 would undergo pattern matching 1112 during the routing process 1114.

Based upon the pattern checking 1112, any immediate recognition of hotspots in the proposed routing can be corrected. As only hotspots that have previously been encountered are flagged with this flow, additional simulation and optimization (e.g., RET) 1116 can be performed to verify that there are no new hotspots and to handle new hotspots if they exist. The output of this simulation/optimization action 1116 is a routed design that has its hotspots corrected 1118, e.g., in a lithographically correct manner, by using manufacturing aware processes such as RET or OPC.

A feedback loop can be implemented for this process to improve the quality of the bad pattern library 1108. Bad patterns can be added to the bad pattern library 1108 from the back-end simulation/optimization actions when they are identified.

In other embodiments, the flow in FIG. 11 uses a good pattern library instead of the bad pattern library 1108.

Figure 12:
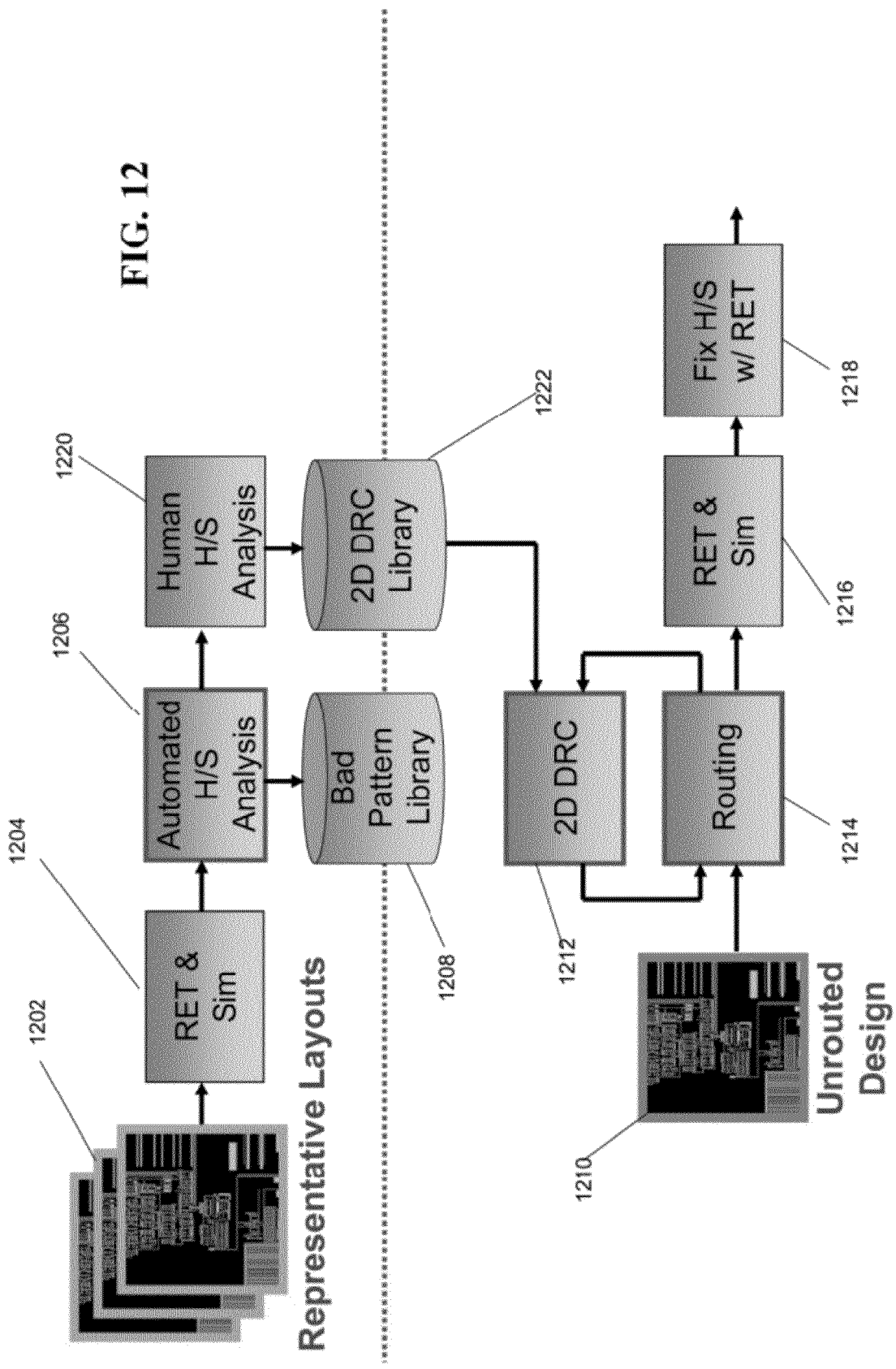

FIG. 12 shows an improved routing flow that takes advantage of pattern matching to optimize designs for routing and to improve the quality of rules used for DRC operations. In this flow, the representative layouts 1202 are used with simulation and optimizations activities 1204 to perform automated hotspot detection 1206 to generate a bad pattern library 1208. An un-routed design 1210 would undergo pattern matching 1212 during the routing process 1214. The bad pattern library 1208 is used as described in FIG. 11.

In addition, additional hotspot analysis 1220 would be performed to determine whether any of the hotspots are such that they deserve inclusion as new 2D DRC rules within DRC ruledecks 1222. In some embodiments this action is performed as a user-based analysis rather than automated analysis. Alternatively, this action can be automated as well, e.g., based upon heuristic rules. In some approaches, the bad patterns are upgraded to the new DRC rules only if they occur frequently or are critical in nature. It is contemplated that there will be greater numbers of bad patterns in the bad pattern library 1208 as compared to the number of new DRC rules within the new DRC library 1222. In some embodiments, the new 2D DRC rules can include a representation of the pattern itself that can be used by a pattern matcher.

Based upon the 2D DRC checking 1212, any immediately recognition of DRC violations from the new 2D DRC library 1222 can be identified. The known hotspots that have been chosen to be included as rules within the new DRC library 1222 can therefore be identified and corrected. Any further hotspots that have not been included as rules can be identified and corrected by performing additional simulation and optimization (e.g., RET) 1216 upon the routed design. The output of this simulation/optimization action 1216 is a routed design that has its hotspots corrected 1218, e.g., in a lithographically correct manner, by using manufacturing aware processes such as RET or OPC. In some embodiments, the 2D DRC checking 1212 can include a pattern matching step to quickly find the bad patterns that have been included as new 2D DRC rules in the DRC ruledeck 1222.

A feedback loop can be implemented for this process to improve the quality of the bad pattern library 1208 and to determine whether any additional DRC rules should be implemented in the DRC library 1222.

System Architecture Overview

Figure 13:
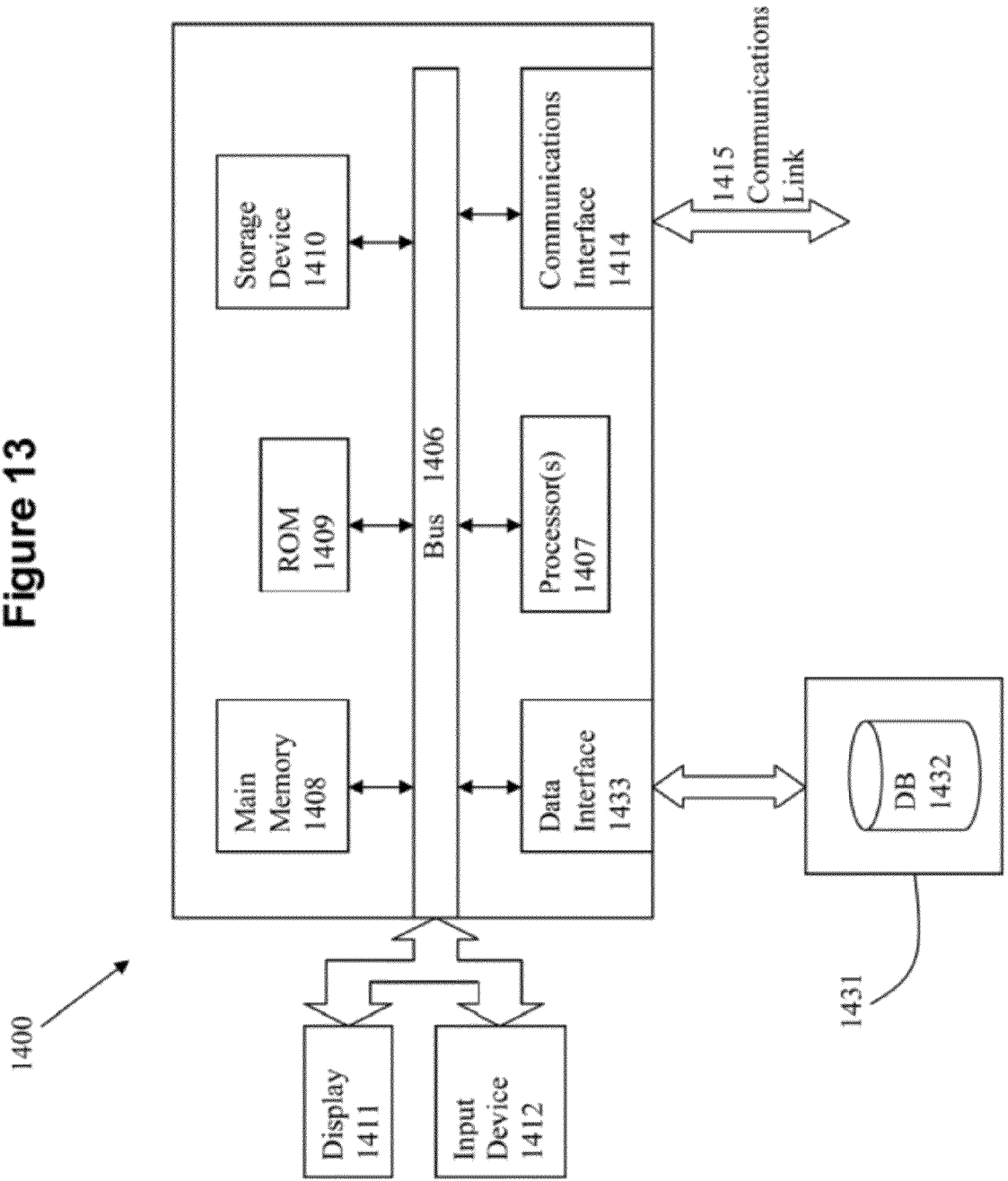
FIG. 13 shows an architecture of an example computing system with which the invention may be implemented.

FIG. 13 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A computer implemented method for building a fast model to implement routing for an electronic design, comprising:

using at least one processor to perform a process, the process comprising:

performing manufacturing aware analysis upon a layout to identify one or more patterns associated with the layout that correspond to one or more good or bad patterns to verify or improve at least a portion of the layout with a physical electronic design implementation tool, rather than using a separate circuit verification tool, during physical implementation of the layout with the physical electronic design implementation tool, wherein the one or more patterns correspond to post-routing layout objects in the layout;

generating one or more libraries of the patterns, the one or more libraries to be used by a physical electronic design implementation tool to implement the layout of an electronic design; and storing the one or more libraries into a non-transitory computer readable medium.

2. The computer implemented method of claim 1, in which the one or more libraries comprise an exact library which comprises a set of patterns that will be exactly matched during analysis of the electronic design.

3. The computer implemented method of claim 1, in which a hash function is employed to implement the exact library.

4. The computer implemented method claim 1, in which the one or more libraries comprise an inexact library which comprises a set of patterns that does not have to be exactly matched during analysis of an electronic design.

5. The computer implemented method of claim 4, in which a neural net is employed to implement the inexact library.

6. The computer implemented method claim 1, in which the one or more libraries comprise a known good pattern library and a known bad pattern library.

7. The computer implemented method of claim 1, in which retargeting is employed to generate data for pattern extraction.

8. The computer implemented method of claim 1, in which a lossy reduction is employed to reduce data quantity for storage in the one or more libraries.

9. The computer implemented method of claim 1, in which the manufacturing aware analysis is used to generate a score for a portion of the layout.

10. The computer implemented method of claim 1, in which a set of scores is generated, wherein the set of scores comprises scores only for hotspots, scores only for good patterns, or scores for all analyzed patterns.

11. A system for routing an electronic design, comprising:
at least one processor that is to:
perform manufacturing aware analysis upon a layout to identify one or more patterns associated with the layout that correspond to one or more good or bad patterns to verify or improve at least a portion of the layout with a physical electronic design implementation tool, rather than using a separate circuit verification tool, during physical implementation of the layout with the physical electronic design implementation tool, wherein the one or more patterns correspond to post-routing layout objects;

generate one or more libraries of the patterns, the one or more libraries to be used by a physical electronic design implementation tool to implement the layout of an electronic design; and store the one or more libraries into a non-transitory computer readable medium.

12. The system of claim 11, in which the one or more libraries comprise an exact library which comprises a set of patterns that will be exactly matched during analysis of the electronic design.

13. The system of claim 11, in which the one or more libraries comprise an inexact library which comprises a set of patterns that does not have to be exactly matched during analysis of an electronic design.

14. The system of claim 11, in which the at least one processor is further to:

generate data for pattern extraction by using a retargeting technique.

15. The system of claim 14, in which the at least one processor that is to generate data by using the retargeting technique is further to:

mimic or recreate of an existing design flow for replicate a processing result or a simulation result of the existing design flow.

16. A computer program product comprising a non-transitory computer accessible storage medium having stored thereupon a sequence of instructions which, when executed by at least one processor, causes the at least one processor to execute a method for routing an electronic design, the method comprising:

using at least one processor to perform a process, the process comprising:

performing manufacturing aware analysis upon a layout to identify one or more patterns associated with the layout that correspond to one or more good or bad patterns to verify or improve at least a portion of the layout with a physical electronic design implementation tool, rather than using a separate circuit verification tool, during physical implementation of the layout with the physical electronic design implementation tool, wherein the one or more patterns correspond to post-routing layout objects in the layout;

generating one or more libraries of the one or more patterns, the one or more libraries to be used by a physical design implementation tool to implement the layout of an electronic design; and storing the one or more libraries into a non-transitory computer readable medium.

17. The computer program product of claim 16, in which the one or more libraries comprise an exact library which comprises a set of patterns that will be exactly matched during analysis of the electronic design.

18. The computer program product of claim 16, in which the one or more libraries comprise an inexact library which comprises a set of patterns that does not have to be exactly matched during analysis of an electronic design.

19. The computer program product of claim 16, in which the process further comprises:

generating data for pattern extraction by using a retargeting technique.

20. The computer program product of claim 19, in which the action of generating the data comprises:

mimicking or recreating of an existing design flow for replicate a processing result or a simulation result of the existing design flow.

* * * * *